(12) United States Patent  
Negley et al.

(10) Patent No.: US 8,969,908 B2
(45) Date of Patent: Mar. 3, 2015

(54) UNIFORM EMISSION LED PACKAGE

(75) Inventors: Gerald Negley, Hillsborough, NC (US); Michael Leung, Ventura, CA (US); Maryanne Becerra, Santa Barbara, CA (US); Eric Tarsa, Goleta, CA (US); Peter Andrews, Durham, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/398,214

(22) Filed: Apr. 4, 2006

(65) Prior Publication Data

US 2007/0228387 A1    Oct. 4, 2007

(51) Int. Cl.
*H01L 33/00* (2010.01)
*H01L 33/50* (2010.01)
*H01L 33/48* (2010.01)

(52) U.S. Cl.
CPC ............ *H01L 33/505* (2013.01); *H01L 33/486* (2013.01); *H01L 33/507* (2013.01); *H01L 2924/0002* (2013.01)
USPC ...................... 257/100; 257/99; 257/E33.059

(58) Field of Classification Search
USPC ........................................................ 257/100
See application file for complete search history.

(56) References Cited

U.S. PATENT DOCUMENTS

| | | | |
|---|---|---|---|
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 5,027,168 A | 6/1991 | Edmond | 357/17 |
| 5,200,022 A | 4/1993 | Kong et al. | 156/612 |
| 5,210,051 A | 5/1993 | Carter, Jr. | 437/107 |
| 5,277,840 A | 1/1994 | Osaka et al. | 252/301.36 |
| 5,338,944 A | 8/1994 | Edmond et al. | 257/76 |
| RE34,861 E | 2/1995 | Davis et al. | 437/100 |
| 5,393,993 A | 2/1995 | Edmond et al. | 257/77 |

(Continued)

FOREIGN PATENT DOCUMENTS

| DE | 102005062514 | 3/2007 |
|---|---|---|
| EP | 0732740 A2 | 9/1996 |

(Continued)

OTHER PUBLICATIONS

Nichia Corp. White LED, Part No. NSPW312BX, "Specifications for Nichia White LED, Model NSW312BS", pp. 1-14, 2004.

(Continued)

*Primary Examiner* — Benjamin Sandvik
(74) *Attorney, Agent, or Firm* — Koppel, Patrick, Heybl & Philpott

(57) ABSTRACT

An emitter package comprising a light emitting diode (LED) mounted to the surface of a submount with the surface having a first meniscus forming feature around the LED. A matrix encapsulant is included on the surface and covering the LED. The outer edge of the matrix encapsulant adjacent the surface is defined by the meniscus forming feature and the encapsulant forms a substantially dome-shaped covering over said LED. A method for manufacturing an LED package by providing a body with a surface having a first meniscus holding feature. An LED is mounted to the surface with the meniscus holding feature around the LED. A liquid matrix encapsulant is introduced over the LED and the surface, the first meniscus holding feature holding the liquid matrix encapsulant in a dome-shape over the LED. The matrix encapsulant is then cured.

25 Claims, 5 Drawing Sheets

(56) References Cited

U.S. PATENT DOCUMENTS

| | | | |
|---|---|---|---|
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,739,554 A | 4/1998 | Edmond et al. | 257/103 |
| 5,766,987 A | 6/1998 | Mitchell et al. | 438/126 |
| 5,813,753 A | 9/1998 | Vriens et al. | 362/293 |
| 5,858,278 A | 1/1999 | Itoh et al. | 252/301.4 R |
| 5,912,477 A | 6/1999 | Negley | 257/95 |
| 5,923,053 A | 7/1999 | Jakowetz et al. | 257/95 |
| 5,959,316 A | 9/1999 | Lowery | |
| 5,998,925 A | 12/1999 | Shimizu | 313/503 |
| 6,001,671 A | 12/1999 | Fjelstad | 438/112 |
| 6,066,861 A | 5/2000 | Horn et al. | 257/99 |
| 6,069,440 A | 5/2000 | Shimizu et al. | 313/486 |
| 6,087,202 A | 7/2000 | Exposito et al. | 438/113 |
| 6,096,440 A | 8/2000 | Moriya et al. | 428/522 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi | 438/112 |
| 6,187,606 B1 | 2/2001 | Edmond et al. | 438/46 |
| 6,188,230 B1 | 2/2001 | Birk | 324/756 |
| 6,201,262 B1 | 3/2001 | Edmond et al. | 257/77 |
| 6,252,254 B1 | 6/2001 | Soules et al. | 257/89 |
| 6,329,224 B1 | 12/2001 | Nguyen et al. | 438/127 |
| 6,331,063 B1 | 12/2001 | Kamada et al. | 362/237 |
| 6,338,813 B1 | 1/2002 | Hsu et al. | 264/272.14 |
| 6,376,277 B2 | 4/2002 | Corisis | 438/106 |
| 6,395,564 B1 | 5/2002 | Huang | |
| 6,404,125 B1 | 6/2002 | Garbuzou et al. | 313/499 |
| 6,483,196 B1 * | 11/2002 | Wojnarowski et al. | 257/778 |
| 6,501,100 B1 | 12/2002 | Srivastava | |
| 6,522,065 B1 | 2/2003 | Srivastava | |
| 6,531,328 B1 | 3/2003 | Chen | 438/26 |
| 6,577,073 B2 | 6/2003 | Shimizu et al. | |
| 6,583,444 B2 | 6/2003 | Fjelstad | 257/82 |
| 6,598,998 B2 * | 7/2003 | West et al. | 362/307 |
| 6,610,563 B1 | 8/2003 | Waitl et al. | 438/166 |
| 6,624,058 B1 | 9/2003 | Kazama | 438/612 |
| 6,635,363 B1 | 10/2003 | Duclos et al. | 428/690 |
| 6,642,652 B2 | 11/2003 | Collins, III | 313/512 |
| 6,653,765 B1 | 11/2003 | Levinson | |
| 6,733,711 B2 | 5/2004 | Durocher et al. | 264/272.14 |
| 6,746,295 B2 * | 6/2004 | Sorg | 445/24 |
| 6,747,406 B1 | 6/2004 | Bortscheller et al. | 313/512 |
| 6,759,266 B1 | 7/2004 | Hoffman | 438/64 |
| 6,791,119 B2 | 9/2004 | Slater, Jr. et al. | 257/99 |
| 6,791,259 B1 | 9/2004 | Stokes | |
| 6,793,371 B2 | 9/2004 | Lamke et al. | 362/241 |
| 6,812,500 B2 | 11/2004 | Reeh et al. | 257/98 |
| 6,841,934 B2 | 1/2005 | Wang et al. | 313/512 |
| 6,853,010 B2 | 2/2005 | Slater, Jr. et al. | 257/98 |
| 6,860,621 B2 * | 3/2005 | Bachl et al. | 362/373 |
| 6,891,259 B2 | 5/2005 | Im et al. | 257/687 |
| 6,919,683 B1 | 7/2005 | Jang | 313/503 |
| 6,939,481 B2 | 9/2005 | Srivastava | |
| 6,958,497 B2 | 10/2005 | Emerson et al. | 257/94 |
| 7,023,019 B2 | 4/2006 | Maeda et al. | 257/89 |
| 7,029,935 B2 | 4/2006 | Negley et al. | |
| 7,049,159 B2 | 5/2006 | Lowery | 438/22 |
| 7,126,273 B2 | 10/2006 | Sorg | 313/512 |
| 7,176,612 B2 | 2/2007 | Omoto et al. | 313/487 |
| 7,183,587 B2 | 2/2007 | Negley et al. | 257/99 |
| 7,195,944 B2 | 3/2007 | Tran et al. | 438/46 |
| 7,202,598 B2 | 4/2007 | Juestel et al. | 313/503 |
| 7,260,123 B2 | 8/2007 | Sato | 372/22 |
| 7,286,296 B2 | 10/2007 | Chaves et al. | 359/641 |
| 7,312,106 B2 | 12/2007 | Raben | 438/112 |
| 7,361,938 B2 | 4/2008 | Mueller et al. | 257/94 |
| 7,371,603 B2 | 5/2008 | Kim et al. | 438/64 |
| 7,510,890 B2 | 3/2009 | Ott et al. | 438/29 |
| 7,601,550 B2 | 10/2009 | Bogner | |
| 7,646,035 B2 | 1/2010 | Loh et al. | 257/99 |
| 7,655,957 B2 * | 2/2010 | Loh et al. | 257/99 |
| 7,710,016 B2 * | 5/2010 | Miki et al. | 313/502 |
| 7,804,103 B1 | 9/2010 | Zhai et al. | 257/98 |
| 7,834,375 B2 * | 11/2010 | Andrews | 257/100 |
| 7,858,403 B2 | 12/2010 | Hiller et al. | |
| 7,910,938 B2 | 3/2011 | Hussell et al. | 257/98 |
| 7,994,531 B2 | 8/2011 | Lin et al. | 257/98 |
| 8,207,546 B2 | 6/2012 | Harada et al. | 257/98 |
| 2002/0001869 A1 | 1/2002 | Fjelstad | |
| 2002/0006040 A1 | 1/2002 | Kamada et al. | |
| 2002/0057057 A1 | 5/2002 | Sorg | |
| 2002/0070449 A1 * | 6/2002 | Yagi et al. | 257/734 |
| 2002/0079837 A1 | 6/2002 | Okazaki | |
| 2002/0096789 A1 | 7/2002 | Bolken | |
| 2002/0105266 A1 | 8/2002 | Juestel et al. | |
| 2002/0123164 A1 | 9/2002 | Slater, Jr. et al. | |
| 2002/0185965 A1 | 12/2002 | Collins, III et al. | |
| 2002/0195935 A1 | 12/2002 | Jager et al. | |
| 2003/0006418 A1 | 1/2003 | Emerson et al. | |
| 2003/0038596 A1 | 2/2003 | Ho | |
| 2003/0066311 A1 | 4/2003 | Li et al. | |
| 2003/0121511 A1 | 7/2003 | Hashimura et al. | |
| 2003/0141510 A1 | 7/2003 | Brunner et al. | 257/81 |
| 2003/0160258 A1 | 8/2003 | Oohata | |
| 2003/0207500 A1 | 11/2003 | Pichler et al. | |
| 2004/0004435 A1 | 1/2004 | Hsu | |
| 2004/0012958 A1 | 1/2004 | Hashimoto | |
| 2004/0037949 A1 | 2/2004 | Wright | |
| 2004/0038442 A1 | 2/2004 | Kinsman | |
| 2004/0041159 A1 | 3/2004 | Yuri et al. | |
| 2004/0041222 A1 | 3/2004 | Loh | |
| 2004/0056260 A1 | 3/2004 | Slater, Jr. et al. | |
| 2004/0080939 A1 * | 4/2004 | Braddell et al. | 362/240 |
| 2004/0106324 A1 | 6/2004 | Kaneko | |
| 2004/0124429 A1 * | 7/2004 | Stokes et al. | 257/98 |
| 2004/0264193 A1 | 12/2004 | Okumura | 362/276 |
| 2005/0002168 A1 | 1/2005 | Narhi et al. | |
| 2005/0006651 A1 | 1/2005 | LeBoeuf et al. | |
| 2005/0051782 A1 | 3/2005 | Negley et al. | |
| 2005/0057813 A1 | 3/2005 | Hasei et al. | |
| 2005/0072981 A1 | 4/2005 | Suenaga | |
| 2005/0093004 A1 | 5/2005 | Yoo | |
| 2005/0122031 A1 * | 6/2005 | Itai et al. | 313/498 |
| 2005/0135105 A1 * | 6/2005 | Teixeira et al. | 362/294 |
| 2005/0211991 A1 | 9/2005 | Mori et al. | |
| 2005/0221519 A1 | 10/2005 | Leung et al. | |
| 2005/0253151 A1 | 11/2005 | Sakai et al. | |
| 2005/0265404 A1 | 12/2005 | Ashdown | |
| 2005/0280894 A1 | 12/2005 | Hartkop et al. | |
| 2006/0001046 A1 | 1/2006 | Batres et al. | 257/202 |
| 2006/0003477 A1 | 1/2006 | Braune et al. | |
| 2006/0034082 A1 * | 2/2006 | Park et al. | 362/268 |
| 2006/0091788 A1 | 5/2006 | Yan | |
| 2006/0102914 A1 * | 5/2006 | Smits et al. | 257/98 |
| 2006/0157721 A1 | 7/2006 | Tran et al. | |
| 2006/0163589 A1 | 7/2006 | Fan et al. | |
| 2006/0258028 A1 | 11/2006 | Paolini et al. | 438/22 |
| 2007/0012940 A1 | 1/2007 | Suh et al. | |
| 2007/0018573 A1 | 1/2007 | Shioi | |
| 2007/0096131 A1 | 5/2007 | Chandra | |
| 2007/0165403 A1 | 7/2007 | Park | |
| 2007/0205425 A1 | 9/2007 | Harada | 257/98 |
| 2007/0295975 A1 | 12/2007 | Omae | 257/89 |
| 2008/0006815 A1 | 1/2008 | Wang et al. | |
| 2008/0006839 A1 | 1/2008 | Lin | 257/98 |
| 2008/0012036 A1 * | 1/2008 | Loh et al. | 257/99 |
| 2008/0023711 A1 * | 1/2008 | Tarsa et al. | 257/98 |
| 2008/0173884 A1 | 7/2008 | Chitnis et al. | |
| 2009/0014736 A1 | 1/2009 | Ibbetson et al. | 257/98 |
| 2009/0057690 A1 | 3/2009 | Chakraborty | |
| 2009/0065791 A1 | 3/2009 | Yen et al. | 257/96 |
| 2009/0086475 A1 | 4/2009 | Caruso et al. | 362/231 |
| 2009/0117672 A1 | 5/2009 | Caruso et al. | |
| 2009/0261358 A1 | 10/2009 | Chitnis et al. | 257/88 |
| 2010/0155750 A1 | 6/2010 | Donofrio | 257/91 |
| 2010/0230708 A1 * | 9/2010 | Tran | 257/99 |
| 2010/0308361 A1 | 12/2010 | Beeson et al. | 257/98 |

(56) References Cited

U.S. PATENT DOCUMENTS

| | | |
|---|---|---|
| 2011/0070668 A1 | 3/2011 | Hiller et al. |
| 2011/0070669 A1 | 3/2011 | Hiller et al. |
| 2011/0180829 A1 | 7/2011 | Cho |

FOREIGN PATENT DOCUMENTS

| | | |
|---|---|---|
| EP | 1059678 | 12/2000 |
| EP | 1059678 A2 | 12/2000 |
| EP | 1198016 A2 | 4/2001 |
| EP | 1138747 | 10/2001 |
| EP | 1367655 | 12/2003 |
| EP | 1385215 A2 | 1/2004 |
| EP | 1724848 A | 11/2006 |
| EP | 1724848 A2 | 11/2006 |
| FR | 2704690 A | 4/1994 |
| FR | 2704690 | 11/1994 |
| JP | H0428269 | 1/1992 |
| JP | 11040848 | 2/1999 |
| JP | H1140848 | 2/1999 |
| JP | 2000002802 | 1/2000 |
| JP | 2000208820 A | 7/2000 |
| JP | 2000-315823 | 11/2000 |
| JP | 2000315823 | 11/2000 |
| JP | 2002009097 A | 1/2002 |
| JP | 2002009347 | 1/2002 |
| JP | 2002-050799 A | 2/2002 |
| JP | 2002-50799 A | 2/2002 |
| JP | 2002-076446 | 3/2002 |
| JP | 2002-531955 | 9/2002 |
| JP | 2002-531956 | 9/2002 |
| JP | 2003-197973 | 7/2003 |
| JP | 2003-526212 | 9/2003 |
| JP | 2003-303999 | 10/2003 |
| JP | 2003-318448 | 11/2003 |
| JP | 2003-533852 | 11/2003 |
| JP | 2004-501512 | 1/2004 |
| JP | 2004179343 | 6/2004 |
| JP | 2004363343 | 12/2004 |
| JP | 2005508093 | 3/2005 |
| JP | 2005298817 | 10/2005 |
| JP | 2006054209 | 2/2006 |
| JP | 2006303303 | 11/2006 |
| JP | 2006303373 | 11/2006 |
| JP | 2007324608 | 12/2007 |
| WO | WO 00/33390 | 6/2000 |
| WO | WO0124283 A1 | 4/2001 |
| WO | WO0124283 A | 5/2001 |
| WO | WO0218560 | 3/2002 |
| WO | WO 03/021668 A1 | 3/2003 |
| WO | WO03021691 A1 | 3/2003 |
| WO | WO2005101909 | 10/2005 |
| WO | WO2006033695 A2 | 3/2006 |
| WO | WO2006036251 A1 | 4/2006 |
| WO | WO2007049187 | 5/2007 |
| WO | WO2008003176 A1 | 1/2008 |

OTHER PUBLICATIONS

Nichia Corp. White LED, Part No. NSPW300BS, "Specifications for Nichia White LED Model NSPW300BS", pp. 1-14, 2004.
NPO—30394 Electrophoretic Deposition for Fabricating Microbatteries, p. 1-2, NASA Tech Briefs Issue May 3, 2003.
Lau, John "Flip-Chip" Technologies, McGraw Hill, 1996.
International Materials Reviews "Materials for Field Emission Displays", A.P. Burden 2001.
PCT Search Report and Written Opinion Oct. 31, 2007.
PCT International Search Report and Written Opinion, PCT/US2007/024366,Date: Jul. 15, 2008.
Official Notice of Rejection Mailed Jul. 29, 2008, Japanese Patent Application No. 2007-533459.
Patent Abstracts of Japan 2004-221185 Aug. 5, 2004.
Patent Abstracts of Japan 11-040858, Feb. 12, 1999.
Patent Abstract of Japan 2001-181613, Jul. 3, 2001.
Official Notice of Rejection re related Japanese Patent Application No. 2007-533459, Dated: Jul. 29, 2008.
Patent Abstracts of Japan, Pub. No. 2001-181613,Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
International Search Report and Written Opinion for PCT/US2007/024367, Dated: Oct. 22, 2008.
Official Notice of Final Decision of Rejection re: related Japanese Patent Application No. 2007-533459, dated: Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated: Feb. 18, 2009.
Office Action re related U.S. Appl. No. 10/666,399, dated: Sep. 5, 2008.
Examination of related European Application No. 05 808 825.3-2203, Dated: Mar. 18, 2009.
International Search Report and Written Opinion from related PCT Application No. PCT/US2009/001572, dated: Jul. 17, 2009.
Notice on Reexamination for Chinese Patent Application No. 200580031382.3 mailed May 28, 2010.
Patent Abstracts of Japan No. 2002-050799 dated Feb. 15, 2002 to Stanley Electric Co. Ltd.
From related application. Japanese Patent Application No. 2006-526964, Official Notice of Rejection, mailed Feb. 16, 2010.
Patent Abstracts of Japan, Publication No. 2003-258011 dated Sep. 12, 2003.
Patent Abstracts of Japan, Publication No. 2002-093830 dated Mar. 29, 2002.
Office Action from Japanese Patent Application No. 2007-533459 (Appeal No. 2009-006588) mailed Jul. 16, 2010.
Office Action from counterpart Chinese Patent Application No. 200780012387.0 mailed Jun. 30, 2010.
Summons for Oral Proceedings from European Patent Application No. 05808825.3 dated Sep. 9, 2010.
Notification of the First Office Action for Chinese Patent Application No. 200780050127.2 mailed Aug. 8, 2010.
Notice of Rejection for Japanese Patent Application No. 2006-526964 issued Oct. 5, 2010.
Notification of the First Office Action for Chinese Patent Application No. 200780050197.8 dated Sep. 9, 2010.
Rexamination Decision No. 27346 for Chinese Patent Application No. 200580031382.3 dated Oct. 27, 2010.
Office Action from U.S. Appl. No. 11/656,759, dated: Nov. 25, 2009.
Response to Office Action from U.S. Appl. No. 11/656,759, filed Apr. 26, 2010.
Office Action from U.S. Appl. No. 10/666,399, dated: Dec. 22, 2009.
Response to Office Action from U.S. Appl. No. 10/666,399, filed Mar. 22, 2010.
Office Action from U.S. Appl. No. 12/008,477, dated: Mar. 1, 2010.
Response to Office Action from U.S. Appl. No. 12/008,477, filed May 26, 2010.
Office Action from U.S. Appl. No. 12/077,638, dated: Jul. 7, 2010.
Response to Office Action from U.S. Appl. No. 12/077,638, filed Aug. 30, 2010.
Office Action from U.S. Appl. No. 12/077,638, dated: Sep. 22, 2010.
Response to Office Action from U.S. Appl. No. 12/077,638, dated: Sep. 28, 2010.
Office Action from U.S. Appl. No. 11/982,276, dated: Mar. 25, 2010.
Response to Office Action from U.S. Appl. No. 11/982,276, filed Jun. 21, 2010.
Office Action from U.S. Appl. No. 10/666,399, dated: May 11, 2010.
Response to Office Action from U.S. Appl. No. 10/666,399, filed Aug. 11, 2010.
Office Action from U.S. Appl. No. 11/881,683, dated: May 12, 2010.
Response to Office Action from U.S. Appl. No. 11/881,683, filed Aug. 3, 2010.
Office Action from U.S. Appl. No. 11/656,759, dated: May 21, 2010.
Office Action from U.S. Appl. No. 11/595,720, dated: May 14, 2010.
Response to Office Action from U.S. Appl. No. 11/595,720, filed Jul. 7, 2010.
Office Action from U.S. Appl. No. 11/899,790, dated: Jun. 2, 2010.

(56) References Cited

OTHER PUBLICATIONS

Response to Office Action from U.S. Appl. No. 11/899,790, filed Nov. 1, 2010.
Office Action from U.S. Appl. No. 12/506,989, dated: Jul. 23, 2010.
Office Action from U.S. Appl. No. 11/982,276, dated Aug. 19, 2010.
Response to Office Action from U.S. Appl. No. 11/982,276, filed Nov. 2, 2010.
Office Action from U.S. Appl. No. 12/008,477, dated: Oct. 7, 2010.
Office Action from U.S. Appl. No. 11/827,626, dated: Oct. 7, 2010.
Office Action from U.S. Appl. No. 11/881,683, dated: Oct. 14, 2010.
Notice of Allowance from U.S. Appl. No. 10/666,399, dated: Oct. 14, 2010.
Second Office Action from Chinese Application No 200980121201. 4, Dated: Mar. 5, 2013.
Interrogatory from Japanese Patent Appl. No. 2009-504205, dated Mar. 19, 2013.
First Office Action for counterpart European Patent Application No. 07754163.9 dated Feb. 28, 2011.
Notice of Reasons for Rejection from Japanese Patent Application No. 2011-502981, dated Feb. 5, 2013.
Office Action from Korean Patent Application No. 10-2008-7026531, dated Feb. 14, 2013.
Notice of Rejection for counterpart Japanese Patent Application No. 2009-504205 issued Sep. 13, 2011.
Second Office Action from Chinese Patent Application No. 200780012387.0, dated Sep. 5, 2012.
Third Office Action from Chinese Patent Appl. No. 2007800123870, dated Feb. 14. 2013.
International Search Report and Written Opinion from PCT Appl. No. PCT/US2012/050794, dated Jan. 10. 2013.
Decision of Rejection for Japanese Patent Application No. 2009-504205, dated Jul. 31, 2012.
First Office Action from Chinese Patent Application No. 200980121201.4, dated Jul. 4, 2012.
Examination Report from European Patent Appl. No. 07 754 163-1564, dated Oct. 14, 2013.
Rejection Decision from Chinese Patent Appl No. 200980121201.4, received Sep. 23, 2013.
Decision of Rejection from Japanese Patent Appl. No 2011-502981, dated Sep. 10, 2013.
Office Action from Taiwanese Patent Appl. No. 096111808, dated Nov. 7, 2013.
Office Action from U.S. Appl. No. 11/775,958, dated Oct. 24, 2013.
Office Action from U.S. Appl. No. 12/414,457, dated Jul. 18, 2013.
Response to OA from U.S. Appl. No. 12/414,457, filed Oct. 17, 2013.
Office Action from U.S. Appl. No. 11/775,958, dated Apr. 8, 2013.
Office Action from U.S. Appl. No. 11/827,626, dated Mar. 27, 2013.
Response to OA from U.S. Appl. No. 11/827,626, filed Jun. 20, 2013.
Office Action from U.S. Appl. No. 13/192,293, dated Mar. 27, 2013.
Response to OA from U.S. Appl. No. 13/192,293, filed Jun. 20, 2013.
Office Action from U.S. Appl. No. 13/219,486, dated Feb. 8, 2013.
Response to OA from U.S. Appl. No. 13/219,486, filed May 2, 2013.
Office Action from U.S. Appl. No. 11/827,626, dated Dec. 19, 2012.
Response to OA from U.S. Appl. No. 11/827,626, filed Feb. 8, 2013.
Office Action from U.S. Appl. No. 11/827,626, dated Sep. 17, 2012.
Response to OA from U.S. Appl. No. 11/827,626, filed Dec. 4, 2012.
Office Action from U.S. Appl. No. 13/219,486, dated Aug. 21, 2012.
Response to OA from U.S. Appl. No. 13/219,486, filed Dec. 18, 2012.
Office Action from U.S. Appl. No. 13/219,486, dated Apr. 19, 2012.
Response to OA from U.S. Appl. No. 13/219,486, filed Jul. 12, 2012.
Office Action from U.S. Appl. No. 11/827,626, dated Sep. 28, 2011.
Response to OA from U.S. Appl. No. 11/827,626. filed Feb. 22, 2012.
Office Action from U.S. Appl. No. 12/414,457, dated Apr. 1, 2011.
Response to OA from U.S. Appl. No. 12/414,457, file Jul. 1, 2011.
Office Action from U.S. Appl. No. 12/414,457, dated Nov. 12, 2010.
Response to OA from U.S. Appl. No. 12/414,457, file Jan. 11, 2011.
Office Action from U.S. Appl. No. 12/414,457, dated Jun. 29, 2010.
Response to OA from U.S. Appl. No. 12/414,457, file Oct. 25, 2010.
Extended European Search Report from European Patent Appl. No. 08160051 . 2-1551, dated Apr. 24. 2014.
Allowed Claims from Taiwanese Patent Appl. No. 096111808, dated Jun. 6, 2014.
Office Action from U.S. Appl. No. 11/627,626, dated Jun. 12, 2014.
Response to OA from U.S. Appl. No. 11/827,626, filed Aug. 8, 2014.
Examination Report from European Patent Appl. No. 09728238.8, dated Aug. 6, 2014.
Office Action from related U.S. Appl. No. 11/982,276, dated Dec. 7, 2009.
Office Action from related U.S. Appl. No. 12/077,638, dated; Dec. 8, 2009.
Office Action from U.S. Appl. No. 11/827,626, dated Sep. 30, 2014.
Office Action from U.S. Appl. No .11/775,958, dated Oct. 1, 2014.

* cited by examiner

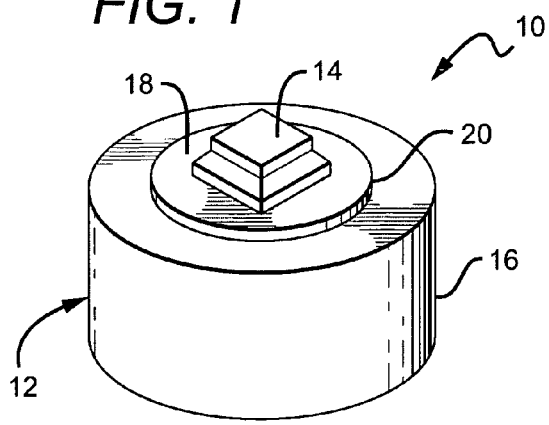
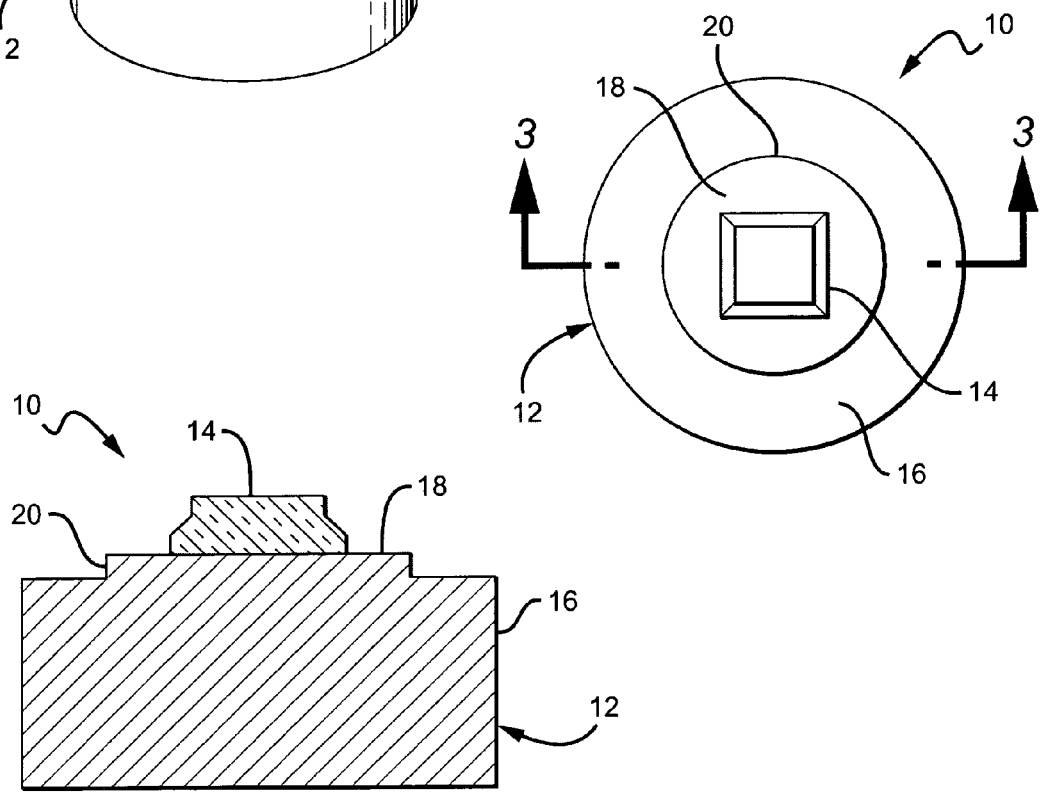
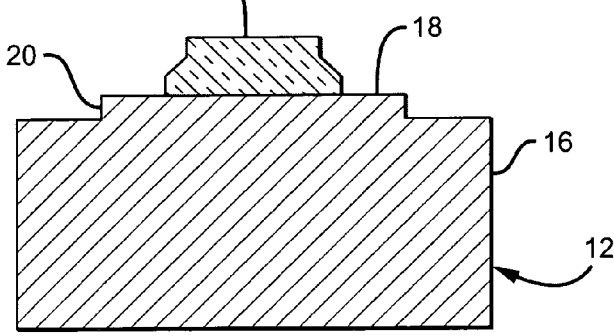
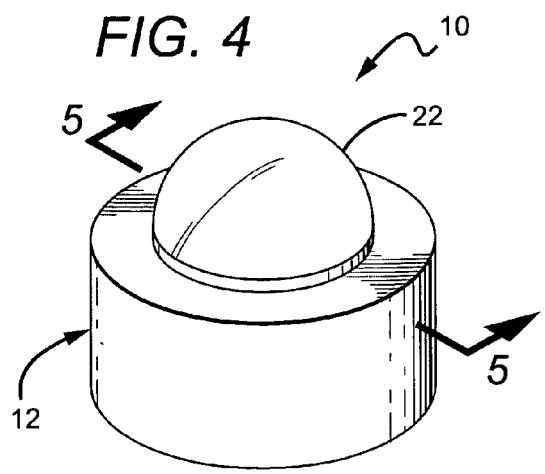

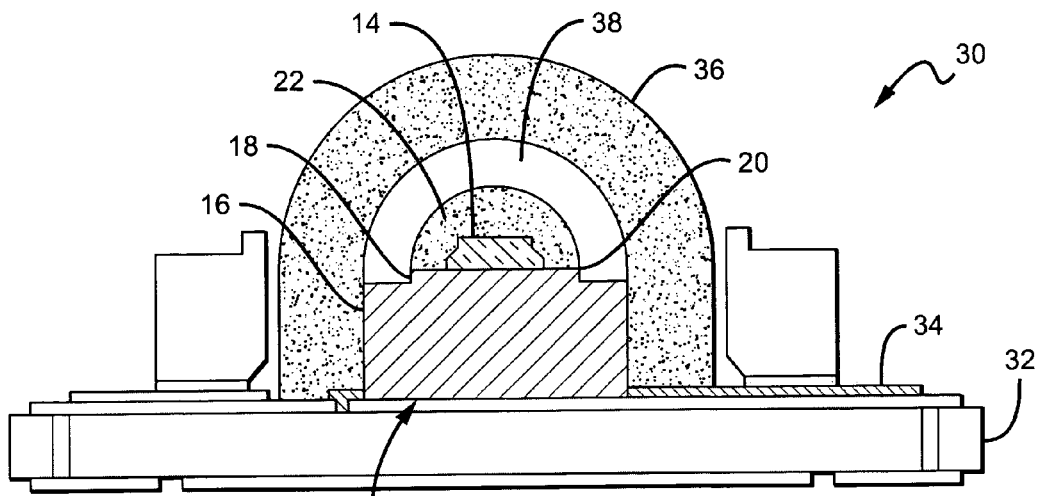
FIG. 8
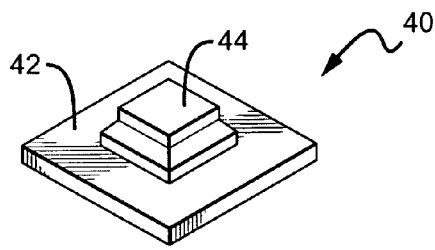
FIG. 9
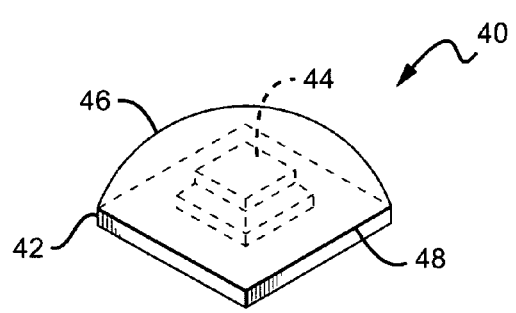
FIG. 10
FIG. 11
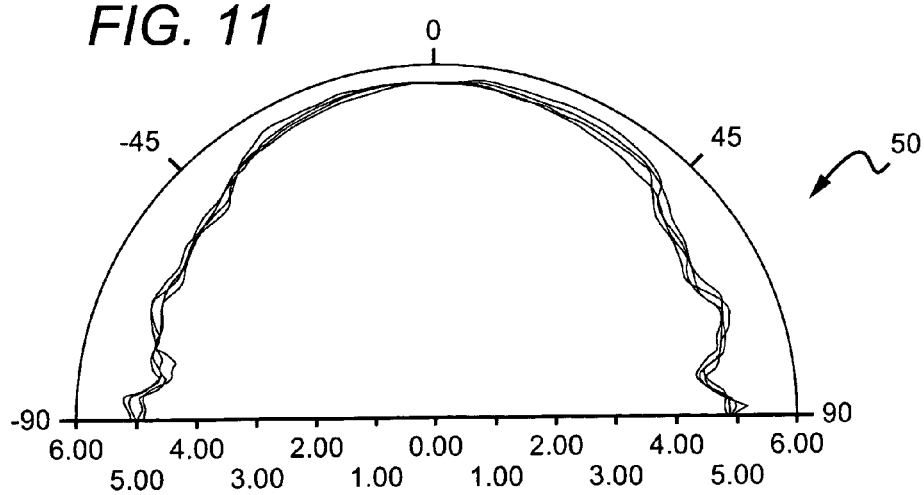

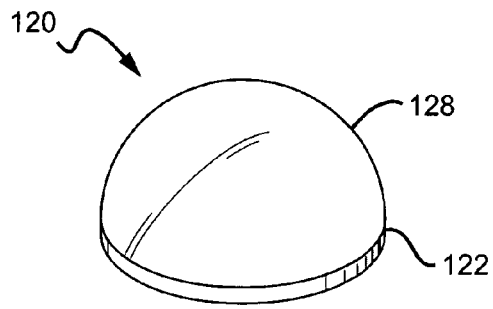
FIG. 17
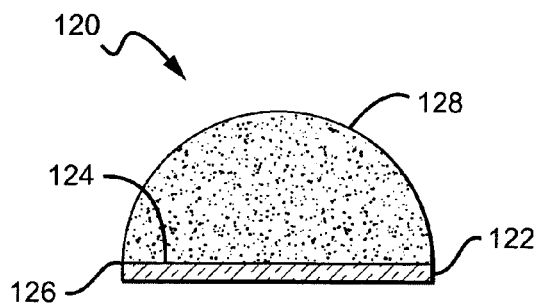
FIG. 18
FIG. 19
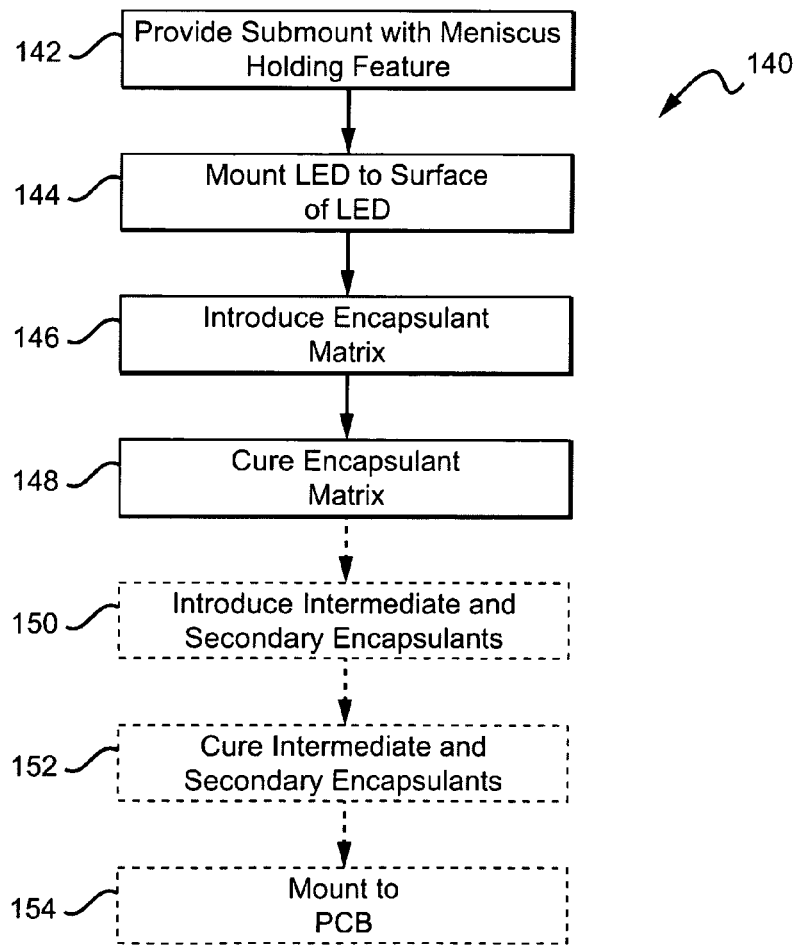

UNIFORM EMISSION LED PACKAGE

BACKGROUND OF THE INVENTION

1. Field of the Invention

This invention relates to semiconductor light emitting diodes (LEDs) and more particularly to LED packages and LED packaging methods.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted omnidirectionally from the active layer and from all surfaces of the LED. The useful light is generally emitted in the direction of the LED's top surface, which is usually p-type.

Conventional LEDs cannot generate white light from their active layers. One way to produce white light from conventional LEDs is to combine different colors from different LEDs. For example, the light from red, green and blue LEDs, or blue and yellow LEDs can be combined to produce white light. In addition, different colors of light are often generated from different types of LEDs which can require complex fabrication to combine in one device. The resulting devices can also require complicated control electronics since the different diode types can require different control voltages. Long term wavelength and stability of these devices is also degraded by the different aging behavior of the different LEDs.

More recently, the light from a single blue emitting LED has been converted to white light by surrounding the LED with a yellow phosphor, polymer or dye. [See Nichia Corp. white LED, Part No. NSPW300BS, NSPW312BS, etc., which comprise blue LEDs surrounded by a yellow phosphor powder. see also U.S. Pat. No. 5,959,316 to Lowery, entitled Multiple Encapsulation of Phosphor-LED Devices.] The surrounding material "downconverts" the wavelength of some of the LED light, changing its color. For example, if a nitride based blue emitting LED is surrounded by a yellow phosphor, some of the blue light will pass through the phosphor without being changed while the remaining light will be downconverted to yellow. The LED will emit both blue and yellow light, which combine to produce white light. Other examples of LEDs using this approach include U.S. Pat. No. 5,813,753 to Vriens et al.

A common type of LED packaging is known as a "glob-in-a-cup" method, where an LED resides at the bottom of a cup-like recession. A phosphor containing matrix material (e.g. phosphor powder distributed in an encapsulant such as silicone or epoxy) is injected into and fills the cup, surrounding and encapsulating the LED. The matrix material is then cured to harden the encapsulant around the LED. This packaging, however, can result in an LED package having significant variation of the color and hue of emitted light at different viewing angles with respect to the package. This color variation can be particularly pronounced in packages where the phosphor containing matrix material extends above the "rim" of the cup in which the LED resides, resulting in a predominance of converted light emitted sideways into high viewing angles (e.g. at 90 degrees from the optic axis). This problem can be made worse by the limited amount of unconverted LED emitting at high viewing angles. The unconverted LED light is typically reflected away from at high viewing angles by the side walls of the cup so that little corresponding unconverted light emits at these angles.

Another method for packaging LEDs comprises direct coupling of phosphor particles onto the surfaces of the LED. This "white chip" method can result in significant improvement of the color uniformity as a function of viewing angle with one reason for this improvement being the source of the converted light and unconverted light being at close to the same point in space. For example, a blue emitting LED covered by a yellow converting material can provide a substantially uniform white light source because the converting material and LED are at close to the same point in space. This method, however, typically requires complex and expensive processing, such as electrophoretic deposition, to achieve uniform phosphor coating directly on an LED.

SUMMARY OF THE INVENTION

Briefly, and in general terms, this invention relates to solid state emitter packages and methods from manufacturing the emitter packages. One embodiment of an emitter package according to the present invention comprises a submount, with a solid state emitter mounted to a surface of the submount. The submount comprises a first meniscus forming feature around said LED. An encapsulant matrix is included on the surface of the submount, and covering said solid state emitter. The encapsulant matrix forms a dome-shape over the emitter, with the size and shape of the encapsulant matrix influenced by the width and shape of the meniscus forming feature.

Another embodiment of an emitter package according to the present invention comprises a solid state emitter mounted to the surface of a body with the surface having a first meniscus forming feature around the emitter. An encapsulant is included on the surface and covering the solid state emitter. The outer edge of the encapsulant adjacent the surface is defined by the meniscus forming feature. The encapsulant forms a substantially dome-shaped covering over said emitter.

One embodiment of a method for manufacturing an LED package according to the present invention comprises providing a body with a surface having a first meniscus holding feature. A solid state emitter is mounted to the surface with the meniscus holding feature around the emitter. A liquid encapsulant matrix is introduced over the LED and the surface, the first meniscus holding feature holding the liquid encapsulant matrix in a dome-shape over the emitter. The matrix encapsulant is then cured.

These and other further features and advantages of the invention will be apparent to those skilled in the art from the following detailed description, taken together with the accompanying drawings, in which:

BRIEF DESCRIPTION OF THE DRAWINGS

FIG. 1 is a perspective view of a circular cylindrical submount and LED used in one embodiment of an LED package according to the present invention;

FIG. 2 is a top view of the submount and LED shown in FIG. 1;

FIG. 3 is a sectional view of one of the submount and LED in FIGS. 1 and 2 taken along section lines 3-3 in FIG. 2;

FIG. 4 is a perspective view of one embodiment of an LED package according to the present invention having the submount and LED in FIGS. 1-3 with a matrix encapsulant;

FIG. 8 is a sectional view of the LED package in FIG. 7, and an intermediate layer encapsulant;

FIG. 9 is a perspective view of a square submount and LED that can be used in another embodiment of an LED package according to the present invention;

FIG. 10 is perspective view of the submount and LED shown in FIG. 9, with a matrix encapsulant;

FIG. 11 is a graph illustrating the CCT performance of one embodiment of an LED package according to the present invention;

FIG. 17 is a perspective view of another embodiment of an LED and matrix material combination according to the present invention;

FIG. 18 is a sectional view of the LED and matrix material combination in FIG. 17; and FIG. 19 is one embodiment of a method for fabricating an LED package according to the present invention.

DETAILED DESCRIPTION OF THE INVENTION

Figure 5:
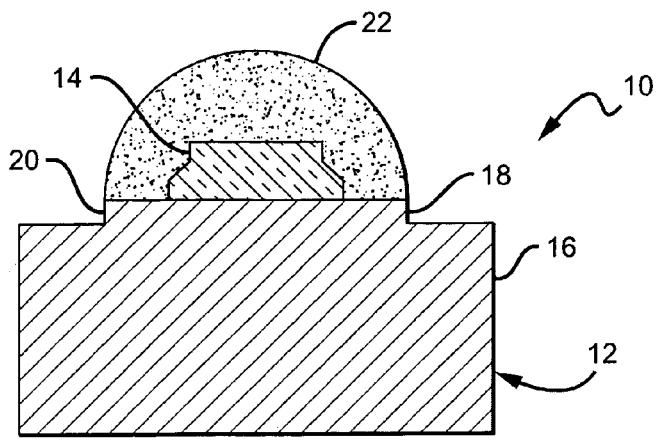
FIG. 5 is sectional view of the LED package shown in FIG. 4, taken along section lines 5-5.

The present invention provides LED packages and methods for fabricating LED packages utilizing a simple, inexpensive dispense process to create a compact, free standing, hemispherical phosphor converter layer surrounding the LED. The phosphor particles in this layer reside close to the chip such that both converted and unconverted light are produced near the same "point in space." This allows the LED package to produce substantially the same ratio of converted and LED light at different viewing angles, thereby producing substantially uniform light at different viewing angles.

The present invention is described herein with reference to certain embodiments but it is understood that the invention can be embodied in many different forms and should not be construed as limited to the embodiments set forth herein. It is also understood that when an element such as a layer, region or substrate is referred to as being "on" another element, it can be directly on the other element or intervening elements may also be present. Furthermore, relative terms such as "upper", "above", "lower", "beneath", "below" and "overlies", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The packages and methods according to the present invention provide solid state lighting devices, such as an LED, with a conversion material, such as phosphors or polymers. The conversion material is provided in an encapsulant matrix, which as used herein generally refers to the curable liquid encapsulant material mixed with light conversion particles, and any other materials such as scattering particles. At least some of the light from the LED is down converted by the conversion material with the package emitting a combination of the LED and converted light. The LED is at least partially surrounded by the encapsulant matrix, and the LED package and packaging method rely on the meniscus forming features provided by a physical geometry that results in a meniscus formed by the surface tension of the encapsulant matrix. This geometry is defined by the physical features such as edges, corners, ledges, trenches, rings, and any other physical or chemical transition that creates a meniscus when a liquid surface comes in contact with it. In one embodiment, a square (or circular, or polygon) is situated under the LED in symmetrical fashion with the LED in the center of the submount, although the LED can be located other than in the submount center. An encapsulant matrix is introduced over the LED and is preferably formed in a hemi-sphere (or dome) shape with the edge of the submount defining the size and location of the meniscus formed.

FIGS. 1-3 show one embodiment of a solid state emitter package 10, comprising a submount 12 and a semiconductor light emitting device 14 mounted to the submount 12. Various embodiments of the present invention are described herein and the term semiconductor light emitting device can include a light emitting diode (LED), laser diode and/or other semiconductor device that includes one or more semiconductor layers. The layers can be made of different material systems including but not limited to silicon or silicon carbide, with a preferred material system being Group-III nitride system. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN.

The layers can be formed on a substrate that can comprise sapphire, silicon, silicon carbide and/or other microelectronic substrates. A suitable silicon carbide substrate is a 4H polytype of silicon carbide, although other silicon carbide polytypes can also be used including 3C, 6H and 15R polytypes.

Silicon carbide can have a closer crystal lattice match to Group III nitrides than other substrate materials and can result in Group III nitride films of higher quality. Silicon carbide also has a very high thermal conductivity to enhance thermal dissipation of the emitting device. SiC substrates are available from Cree Inc., of Durham, N.C. and methods for producing them are set forth in the scientific literature as well as in a U.S. Pat. Nos. Re. 34,861; 4,946,547; and 5,200,022.

The emitting devices can also be formed without a substrate or the substrate can be removed after formation of the emitter layers. In both cases, the emitting device 14 can be mounted in the package 10 without a substrate. The devices can also comprise one or more contact layers which may include metal or other conductive layers. For the package 10 and the other package embodiments described herein, the emitting device 14 will be referred to as an LED and LEDs used in the packages can emit light in many different wavelength spectrums, including but not limited to ultra violet (UV), blue, green, amber or red.

The design and fabrication of semiconductor LEDs is known to those having skill in the art and is not described in detail herein. Generally, the LED layers can be formed on a substrate using known semiconductor growth techniques such as Metal Organic Chemical Vapor Deposition (MOCVD), Hydride Vapor Phase Epitaxy (HVPE), or Molecular Beam Epitaxy (MBE).

In package 10, the submount 12 has a generally cylindrical shape and comprises a lower cylindrical portion 16 and an upper cylindrical portion 18 having a smaller width or diameter than the lower portion 16. The upper portion 18 can be arranged in different locations on the lower portion 16, but is preferable in the center of the top surface of the lower portion 16 so that both are aligned along their longitudinal axis. The submount 12 can be made of many different materials, but is preferably made of a heat conductive material such as a metal. It can be formed of a single construction or can be formed of different portions mounted together. In one embodiment, the submount 12 is a single construction made of nickel plated copper and is fabricated by machine turning or coin stamping.

The LED 14 is mounted to the upper portion 18 using known mounting methods, and is preferably mounted at or near the center of the top surface of the upper portion. As described in more detail below, the submount 12 can be mounted to a separate device, such as a printed circuit board that applies a bias to the LED 14, causing it to emit light. The bias can be applied through the submount 12, wire bonds, or through a combination of both.

The upper portion edge 20 defines the size and location of a first meniscus forming feature that is arranged so that a meniscus forms by surface tension between a liquid converter encapsulant matrix and the edge 20. The term "meniscus" refers to the convex surface of liquid which is formed by surface tension. The diameter or width of the upper portion 18 around the LED 14 and the viscosity of the encapsulant matrix allow the surface tension of the encapsulant matrix at the edge 20 to exceed the force of gravity. Different upper portion diameters (or widths) can be used, and the suitable diameter varies with the viscosity of the encapsulant matrix. The lower the viscosity of the encapsulant matrix, smaller upper portion diameters should be used. While the term viscosity is used herein to describe the formation of the meniscus it is understood that other properties are important to formation of the encapsulant matrix over the LED. Viscosity and other Theological properties can impact encapsulant matrix formation. Viscosity can effect how a meniscus forms initially, but typical viscous fluids (like syrup) flow slowly but will eventually reach an equilibrium shape similar to non-viscous fluids, given enough time. Other thixotropic materials (having properties similar to shaving cream) will not flow or will flow less over time, enabling greater control over meniscus shape. Accordingly, it may be desirable to use thixotropic materials in certain applications, particularly if there is some delay in introduction of the encapsulant matrix and curing.

This meniscus formed at the edge 20 holds the encapsulant matrix in an approximate dome-shape on the upper portion 18, over the LED 14. For meniscus holding features that define a circle around the LED 14, the matrix encapsulant closely approximates a dome of the LED 14. As further described below, the meniscus holding features can take different shapes around the LED (e.g. square, octagon, etc.) and this shape influences the overall shape of the dome-shape over the LED. It is understood that the use of the term "dome-shape" herein includes those domes formed by a circular meniscus holding feature as well as features of other shapes.

FIGS. 4 and 5 show the LED package 10 with a liquid encapsulant matrix 22 introduced over the LED 14 and held on the upper portion 18. The encapsulant matrix 22 can be introduced using many known methods, including but not limited to known syringe or needle injection systems.

The encapsulant matrix 22 preferably comprises a curable liquid such as a silicone, epoxy, resin mixed with a conversion material that preferably comprises conversion particles. In one embodiment the curable liquid comprises commercially available Nusil CFI-6755 Silicone Elastomer. Many different types of conversion particles can be used depending on the emitting wavelength of the LED 14 and the desired wavelength of converted light. In one embodiment according to the present invention the LED 14 emits light in the blue wavelength spectrum and the conversion material absorbs some of the blue light and re-emits yellow, such that the package 10 emits a white light combination of blue and yellow light. A full range of broad yellow spectral emission is possible using conversion particles made of phosphors based on the $(Gd,Y)_3(Al,Ga)_5O_{12}$:Ce system. The following lists other suitable phosphors used as conversion particles in an LED package 10. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}{}_{0.06}$
$(Ba_{1-x-y}Sr_xCa_y)SiO_4$:Eu
$Ba_2SiO_4$:Eu$^{2+}$ Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$ The conversion materials can have different concentrations in the encapsulant matrix depending on the conversion efficiency of the material. The conversion particles can be uniformly dispersed in the encapsulant matrix, or the particles can settle around the LED so that the particles are closer to the LED. The matrix encapsulant 22 can also contain materials to help scatter the light, such as scattering particles. Once the encapsulant matrix 22 is injected in place, it can be cured using known methods, such as heat or UV curing, to harden the encapsulant matrix 22 in place over the LED 14.

Figure 6:
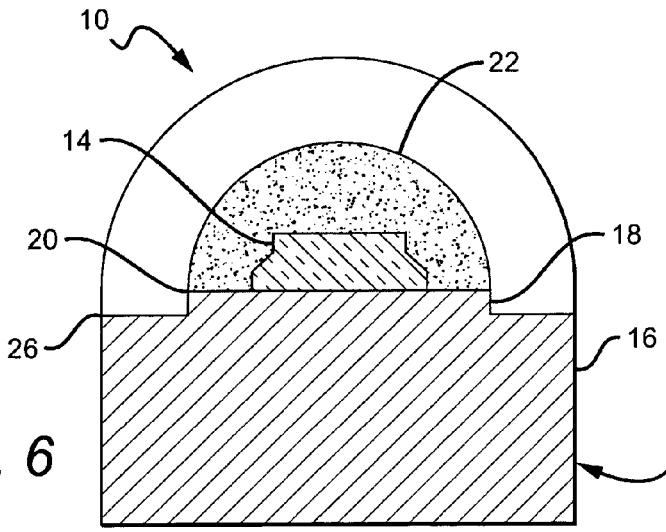
FIG. 6 is a sectional view of another embodiment of an LED package according to the present invention having intermediate encapsulant.

FIG. 6 shows the LED package 10 having a dome shaped intermediate encapsulant 24 over the encapsulant matrix 22. The second edge 26 serves as a second meniscus forming feature and the intermediate encapsulant is injected in place over the cured encapsulant matrix 22. The intermediate encapsulant has a desired viscosity so that the surface tension between the intermediate encapsulant 24 and the second edge 26 forms a meniscus at the second edge 26. This meniscus holds the intermediate encapsulant 24 in a dome over the encapsulant matrix 22. The intermediate encapsulant 24 can be clear material or can contain one or both of conversion and scattering particles. The conversion particles can be the same or different from those in the encapsulant matrix. The intermediate encapsulant 24 can also have the same or different index of refraction as that in the encapsulant matrix 22, and can be cured in place using known curing methods. The intermediate encapsulant 24 can serve as the final encapsulant for the LED package 10.

It is understood, that the package 10 can have more encapsulant layers some of which can form a meniscus with additional submount edges. The encapsulant layers can also have different shapes and can have different conversion and scattering particles. Other combinations of phosphor and encapsulant can also be used to form the phosphor shell.

Figure 7:
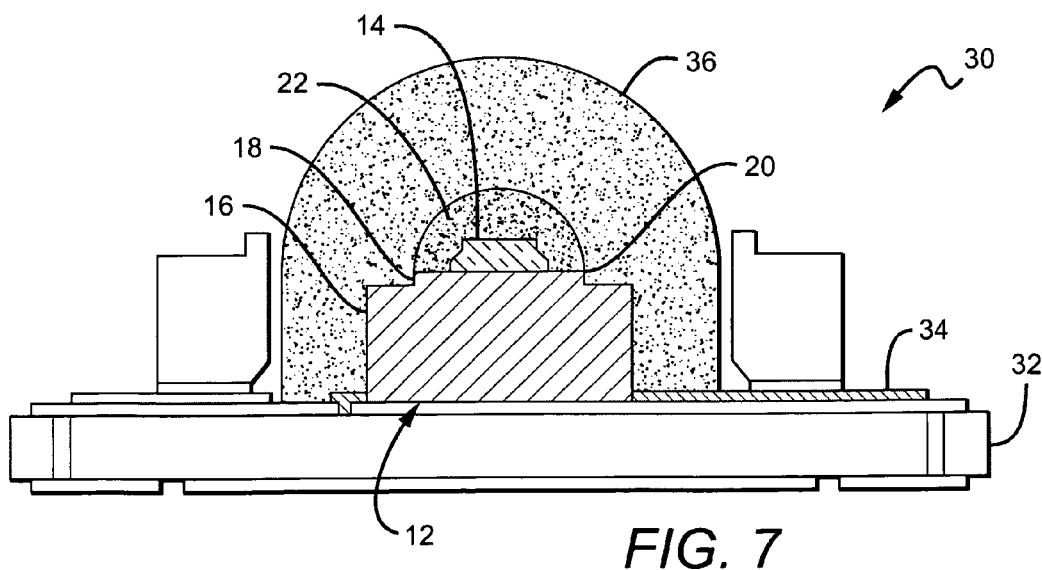
FIG. 7 is a sectional view of another embodiment of an LED package according to the present invention having a submount mounted to a printed circuit board and having a secondary encapsulant.

FIG. 7 shows another embodiment of an LED package 30 according to the present invention, and for features similar to those in LED 10 described above and shown in FIGS. 1-5, the same reference numerals will be used with the understanding that the description above applies to the same features in this embodiment. The LED package 30 comprises a generally cylindrical shaped submount 12 having aligned upper and lower portions 18, 16 with the upper portion having a smaller diameter than the lower portion 16. An LED 14 is mounted to the upper portion with the LED contacted either through the submount 12, through leads, or both. An encapsulant matrix 22 is included on the upper portion 18 and forms a dome over the LED 14 by the meniscus formed by the surface tension between the encapsulant matrix 22 and the upper portion edge 20. The encapsulant matrix 22 is introduced as a liquid and then cured and hardened in place over the LED 14.

The package 30 further comprises a printed circuit board (PCB) 32, with the submount 12 mounted to PCB 32 using known methods. The PCB 32 preferably comprises conductive traces 34 that contact the submount 12 such that an electrical signal applied to the traces 34 conduct to the submount. Leads (not shown) from the traces 34 can also be included from the traces to the LED 14 to provide an electrical signal to the LED 14. A secondary encapsulant 36 (e.g. silicone, epoxy, resins, etc.) having the same or different index of refraction than the matrix encapsulant 22 can be included to cover the encapsulant matrix 22 and the submount 12, and if desired, to cover the surface of the PCB 32 around the submount 12.

Selection of the material used for the secondary encapsulant 36 (and the intermediate encapsulant described above) can enhance the emission efficiency of the package 30. Specifically, factors for improving the overall package emission efficiency include the relative index of refraction of the second encapsulant material and the matrix encapsulant, and the transparency of the second encapsulant as a function of wavelength. A second encapsulant material with high transparency over the relevant emitter converter material transmission wavelengths, and a higher index of refraction than the matrix encapsulant can improve the emission of the package 30. In one embodiment of a package 30 according to the present invention, white light can be produced using a blue LED and a matrix encapsulant having a yellow conversion material, with the package exhibiting substantially uniform correlated color temperature (CCT) at various viewing angles. The brightness of light emitted from the package can also be enhanced with the selection of the secondary encapsulant having the appropriate transparence and index of refraction. Compared to the "glob-in-cup" approach, the close proximity of the sources of converted and LED light also facilitates the uniformity of light emitted. Having the two light sources close together allows both to reside at or near the optical focal point of the optical elements. This provides improved color uniformity by directing or focusing both converted and unconverted light equally, resulting in the projection of a uniform color profile.

FIG. 8 shows the LED package 30 shown in FIG. 7 with an intermediate encapsulant 38 formed over the encapsulant matrix 22 and with the surface tension of the intermediate encapsulant forming a meniscus to hold the intermediate encapsulant 38 in a dome over the encapsulant matrix 22. The intermediate encapsulant 38 can also include conversion materials and scattering particles, and the transparency and index of refraction of the intermediate encapsulant can be chosen to optimize the emission of the package 30.

The efficiency of light emitted from the package can also be improved by changing the shape first and second meniscus forming features. As described above, in packages according to the present invention, the LED can be placed on a round surface, such as a round bond pad, or round reflector surface, or a round submount. The round surface is often used to maximize thermal spread within the smallest area. LEDs, however, typically have a square or rectangular shape, although it is understood that round LEDs could also be used. For square shaped LEDs, the round shape of the surface below the LED provides a meniscus holding feature that typically results in a encapsulant matrix having a substantially uniform dome shape. This may not provide the optimal shape over the square LED to minimize CCT variation.

According to the present invention, the LED can instead be placed on a shape having meniscus holding features influence the dome-shape of the encapsulant matrix to a shape to more closely match the chip near field to optimize CCT variation. FIG. 9 shows another embodiment of a submount/LED combination 40 having a submount 42 to more closely match the shape of the LED 44. The submount 42 has a substantially square upper surface to match the square LED 44 mounted to the upper surface. FIG. 10 shows the LED package 40 in FIG. 9 with an encapsulant matrix 46 introduced over the LED 44 (shown in phantom in FIG. 10) and upper surface of the submount 42. The meniscus holding feature of the package 40 is the submount's upper edge 48 such that the encapsulant marix 46 forms a square influenced dome-shape over the LED 44. That, the encapsulant matrix 46 extends in its dome-shape to reach the corners of the submount upper edge 48, giving the encapsulant matrix a square influenced dome-shape, particularly adjacent to the upper edge 48. The encapsulant matrix 46 can then be cured to harden it over the LED 44.

The square submount 42 is preferably made of a metal conductive or semiconductor material. Square submounts are typically easier to manufacture compared to the cylindrical submounts described above, and can be cut or diced from a larger section of metal. The square submount 42 can also have additional meniscus forming features and encapsulant layers, and can also be mounted to a PCB as described above.

FIG. 11 is a graph 50 showing the correlated color temperature (CCT) of an LED package arranged similar to the package 40 in FIGS. 9 and 10. The package can emit a white light combination of a blue from the LED and yellow from the conversion particles in the encapsulant matrix. The graph shows CCT as a function of viewing angle, and shows substantially uniform CCT across the viewing angles.

Figure 12:
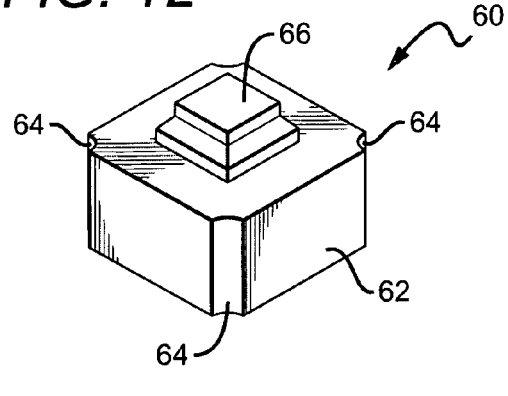
FIG. 12 is a perspective view of another submount and LED combination that can be used in LED packages according to the present invention.

Different submount shapes can be used to tailor the matrix encapsulant to improve the CCT of the LED package. FIG. 12 is a perspective view of another embodiment of a submount/LED combination 60 according to the present invention having a submount 62 that is generally square-shaped to provide a generally square-shaped meniscus forming feature at its edge. The submount 62, however, also comprises notches 64 that can be different sizes and different shapes, and can be arranged in different locations on the submount 62, with the notches 64 as shown are located at the corners of the submount 62. The notches 64 can run along the entire height of the submount 62 or can be located only at the upper surface of the submount to provide the shape of the meniscus holding feature. LED 66 can be mounted to the submounts upper surface, with the edge meniscus forming feature around the LED 66. An encapsulant matrix can then be introduced on the upper surface covering the LED 66. The surface tension of the matrix encapsulant at the submount's upper edge forms a meniscus that holds the encapsulant matrix in a dome-shape over the LED that is influenced by the shape of the submount's upper surface. For example, the notches 64 in the submount will result in notch-type shape in the encapsulant matrix, particularly near the notches 64.

Figure 13:
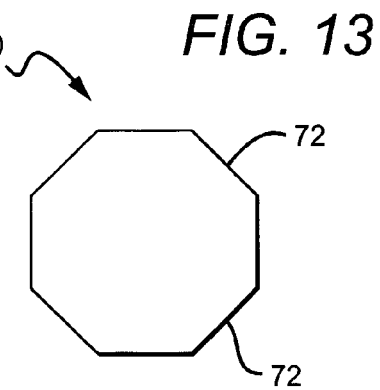
FIG. 13 is a top view of another submount that can be used in LED packages according to the present invention.
Figure 14:
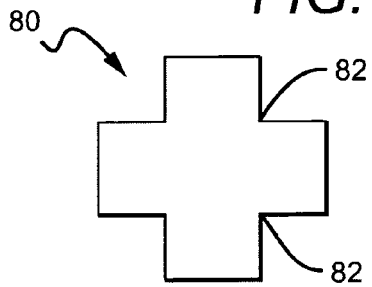
FIG. 14 is a top view of still another submount that can be used in LED packages according to the present invention.

FIGS. 13 and 14 show additional embodiments of submounts 70, 80 according to the present invention, although it is understood that submounts can take many different shapes beyond those shown and described herein. The submount 70 in FIG. 13 is similar to the submount 62 in FIG. 12, but instead of having rounded notches at the corners, the corners 72 are cut off to give the upper surface of the submount a hexagon shape, that provides a hexagon meniscus forming feature. The submount 80 in FIG. 14 is also similar to the submount 62 in FIG. 12, but has notches 82 at the corner that are angled. The notches 82 can have many different angles, with a suitable angle as shown being approximately 90 degrees. In both submounts 70, 80 an LED is mounted to the upper surface as described above, and a matrix encapsulant is introduced on the upper surface, covering the LED and the upper surface. The surface tension of the encapsulant matrix at the submount's upper edge forms a meniscus that holds the encapsulant matrix in a dome-shape over the LED that is influenced by the shape of the submount's upper surface.

Figure 15:
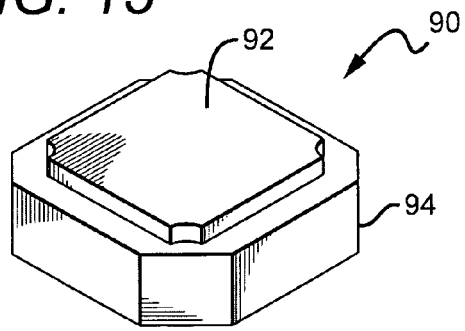
FIG. 15 is a perspective view of another submount according to the present invention having different shaped upper and lower sections.

The submounts described in FIGS. 12-14 can also be formed with additional portions that provide additional meniscus forming features and can form intermediate or secondary encapsulants as described above. FIG. 15 shows another embodiment of a submount 90 according to the present invention having on upper portion 92 and a lower portion 94. The upper portion 92 has a shape similar to the shape of the submount 62 shown in FIG. 12, and the lower portion 94 has an octagonal shape. A LED can be mounted on the upper surface of the upper portion 92 with the upper surface's edge providing a meniscus forming feature around the LED. In subsequent manufacturing steps an encapsulant matrix can be introduced on the upper surface over the LED. The encapsulant matrix forms a dome-shape over the LED that is influenced by the shape of the upper surface. After the encapsulant matrix is cured, an intermediate (or secondary) encapsulant can be introduced over the encapsulant matrix, with the surface tension of the intermediate encapsulant at lower section edge 94 forming a meniscus that holds the matrix encapsulant in a dome-shape over the encapsulant matrix with the shape of the intermediate encapsulant influenced by the shape of the lower portion 94. It is understood that different combinations of upper and lower portion shapes can be used according to the present invention, and additional submount portions can be included for additional encapsulant layers.

It is understood that the different shaped submounts described above can made of a conductive material such as a metal, and can be formed using known methods. It is also understood that each of the submounts can be mounted to a PCB as described above.

Figure 16:
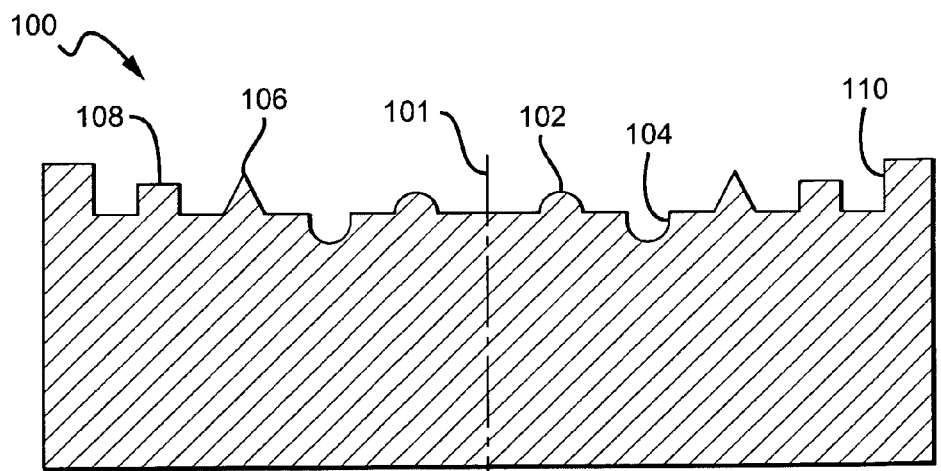
FIG. 16 is a sectional view of a submount showing some alternative meniscus holding features that can be used in LED packages according to the present invention.

As described above, the meniscus holding features can comprise edges, corners, ledges, trenches, rings, and any other physical transition. FIG. 16 shows a submount 100 with alternative physical transitions that can serve as meniscus holding features, with each of the features arranged around the submounts center 101 to provide a meniscus forming feature around an LED mounted at the center. The different features include a rounded ring 102, a trench 104, a triangular ring 106, a square ring 108, and a ledge 110. It is understood that many other physical transitions can be used according to the present invention.

In still other embodiments a chemical transition can be used instead of a physical feature, with the chemical having a surface tension different from the encapsulant. The result is that the chemical experiences non-wetting by the encapsulant which allows for the formation of a meniscus at the chemical. The chemical applied using different methods, with a suitable method being painting the chemical in the desired location. In one embodiment the chemical can be painted in a circle (or other shape) on the submount around the LED (or other emitter) and as the encapsulant matrix is introduced over the LED the meniscus forms the encapsulant matrix in a dome over the LED in much the same way that a physical transition does. Many different chemicals can be used with a suitable chemical being commercially available Nyebar-Q, from Nye® Lubricants.

Other embodiments of the present invention can have a solid state emitter without a submount, with the meniscus being formed by features in other locations. FIGS. 17 and 18 show another embodiment of a solid state emitter package 120 according to the present invention comprising an LED 122 without a submount. The LED 122 is circular, although LEDs with other shapes can also be used. The LED comprises an upper surface 124 and upper surface edge 126. The encapsulant matrix 128 is introduced on the upper surface 124 and as the surface is covered and the encapsulant matrix reaches the edge 126 where a meniscus is formed. This causes the encapsulant matrix to form a dome over the LEDs upper surface.

This embodiment can be used with many different types and thicknesses of LED, but is particularly applicable to thin LEDs. LEDs of many different sizes can be used, with thin LEDs having a height that is much smaller than their diameter. With thin LEDs, most of the emitted light passes through the matrix material, with a small amount passing out the LEDs side surfaces. Thin LEDs can be fabricated in many different ways, with a suitable fabrication method being the formation of the LEDs active layers on a substrate, and then removal of the substrate.

In still other embodiments, one or more physical features can be formed in one or more surfaces of the thin LED to provide additional meniscus holding features. The physical features can be arranged to allow for the formation of a encapsulant matrix dome on the upper surface, or can be arranged to allow for more than one layer of material, such as the multiple layers 22 and 24 shown in FIG. 6 and described above.

FIG. 19 shows one embodiment of a method 140 for fabricating an LED package according to the present invention, and although the method is shown with a series of sequential blocks it is understood that methods according to the present invention can take place in different sequences. In step 142 a submount is provided having a meniscus holding feature, and the submount can be one of those described above or any other submount according to the present invention. The meniscus holding feature can be the edge of a submount surface or any other features according to the present invention including those described above. In step 144 an LED is mounted to a surface of the submount, with the meniscus holding feature around the LED. In step 146 an encapsulant matrix is introduced over the LED and its submount surface. The width/diameter and shape of the meniscus holding feature influences the size and shape of the encapsulant matrix, which preferably takes on a dome-shape over the LED.

In step 148 the encapsulant matrix is cured using known curing methods such as heat curing. In step 150 the method includes the optional introduction of an intermediate/secondary encapsulant over the cured encapsulant matrix, with the intermediate/secondary encapsulant held in a dome shape over the encapsulant matrix by the meniscus formed between at a second matrix forming feature. In step 152 the intermediate/secondary encapsulant can be cured, such as by heat curing. In step, 154 the submount can be optionally mounted to a PCB as described above.

It is understood that for methods for fabricating an LED package that does not have a submount, steps 142 and 144 of the method 140 are not needed. In step 146 the encapsulant matrix is introduced directly on the LED and the edges (or other physical properties) of the LED serve as the meniscus forming features. The remainder of the method 140 can then be performed as described.

Although the present invention has been described in considerable detail with reference to certain preferred configurations thereof, other versions are possible. Therefore, the spirit and scope of the appended claims should not be limited to their preferred versions contained therein.

We claim:

1. An emitter package, comprising:
   a submount;
   a solid state emitter mounted to a surface of said submount, said submount comprising a first meniscus forming feature integral to said submount and around said solid state emitter; and
   an encapsulant matrix on said surface of said submount and covering said solid state emitter, said encapsulant matrix forming a dome-shape over said solid state emitter, the size and shape of said encapsulant matrix at least partially defined by the width and shape of said meniscus forming feature, wherein said meniscus forming feature comprises an edge of said surface;
   a second meniscus forming feature around said first meniscus forming feature; and
   an intermediate encapsulant over said encapsulant matrix, the size and shape of said intermediate encapsulant at least partially defined by the size and shape of said second meniscus forming feature, wherein said second meniscus forming feature comprises an edge of said submount.

2. The package of claim 1, wherein said first meniscus forming feature has a width around said emitter to hold said encapsulant matrix in said dome-shape over said emitter by a meniscus formed between said encapsulant matrix and said meniscus forming feature.

3. The package of claim 1, wherein said solid state emitter comprises a light emitting diode.

4. The package of claim 1, wherein said first meniscus forming feature comprises a physical transition that creates a meniscus when a liquid contacts it.

5. The package of claim 1, wherein said first meniscus forming feature comprises a physical feature from the group an edge, corner, ledge and trench.

6. The package of claim 1, wherein said first meniscus forming feature has a circular, square, rectangular or octagonal shape around said emitter.

7. The package of claim 1, wherein said encapsulant matrix comprises a conversion material.

8. The package of claim 1, wherein said encapsulant matrix is in a dome-shape.

9. The package of claim 8, wherein said second meniscus forming feature comprises a physical transition that creates a meniscus when a liquid contacts it.

10. The package of claim 8, wherein said intermediate encapsulant has a higher index of refraction than said encapsulant matrix.

11. The package of claim 1, wherein said submount is mounted to a printed circuit board.

12. The package of claim 11, comprising a secondary encapsulant covering said encapsulant matrix and said submount.

13. The package of claim 12, wherein said encapsulant matrix comprises a conversion material, and wherein said secondary encapsulant is transparent to the wavelength of light emitted by said emitter and said conversion material, and wherein said secondary encapsulant has a higher index of refraction than said encapsulant matrix.

14. An emitter package, comprising:
   a submount;
   a solid state emitter mounted to a surface of said submount, said submount comprising a first meniscus forming feature around said solid state emitter;
   an encapsulant matrix on said surface of said submount and covering said solid state emitter, said encapsulant matrix forming a dome-shape over said solid state emitter, the size and shape of said encapsulant matrix at least partially defined by the width and shape of said meniscus forming feature, wherein said first meniscus forming feature has a square shape with notches at the corners.

15. An emitter package, comprising:
   a submount;
   a solid state emitter mounted to a surface of said submount, said submount comprising a first meniscus forming feature around said solid state emitter;
   an encapsulant matrix on said surface of said submount and covering said solid state emitter, said encapsulant matrix forming a dome-shape over said solid state emitter, the size and shape of said encapsulant matrix at least partially defined by the width and shape of said meniscus forming feature;
   a second meniscus forming feature around said first meniscus forming feature; and
   an intermediate encapsulant over said encapsulant matrix in a dome-shape, the size and shape of said intermediate encapsulant at least partially defined by the size and shape of said second meniscus forming feature,
   wherein said submount comprises an upper portion and a lower portion, said upper portion having a width smaller than the width of said lower portion, said first meniscus holding feature comprising the edge of said upper portion, and said second meniscus holding feature comprising the edge of said lower portion.

16. An emitter package, comprising:
a solid state emitter mounted to the surface of a body, said surface having a first meniscus forming feature, integral to said body, around said emitter;
an encapsulant matrix on said surface and covering said solid state emitter, the outer edge of said encapsulant matrix adjacent said surface defined by said meniscus forming feature, said encapsulant matrix forming a substantially dome-shaped covering over said emitter, wherein said meniscus forming feature comprises an edge of said surface;
an intermediate encapsulant over said encapsulant matrix in a dome-shape, wherein at least a surface of said intermediate encapsulant conforms to the shape of said encapsulant matrix; and
a second meniscus forming feature around said first meniscus forming feature, wherein the outer edge of said intermediate encapsulant adjacent to said second meniscus forming feature is defined by said second meniscus forming feature, and wherein said second meniscus forming feature comprises an edge of said body.

17. The package of claim 16, wherein said meniscus forming feature has a width around said emitter to hold a liquid in a dome-shape over said emitter by a meniscus formed between said liquid and said meniscus forming feature.

18. The package of claim 16, wherein said solid state emitter comprises a light emitting diode.

19. The package of claim 16, wherein said encapsulant further comprises a conversion material.

20. The package of claim 16, wherein said first meniscus forming feature comprises a physical transition that creates a meniscus when a liquid contacts it.

21. The package of claim 16, wherein said second meniscus forming feature comprises a physical transition that creates a meniscus when a liquid contacts it.

22. The package of claim 16, wherein said encapsulant matrix comprises a conversion material, and wherein said intermediate encapsulant has a higher index of refraction than said encapsulant matrix.

23. An emitter package comprising:
a submount;
a solid state emitter mounted to a surface of said submount, said submount comprising inner and outer meniscus forming features, integral to said submount, around said solid state emitter;
an first encapsulant on said surface of said submount and covering said solid state emitter, the shape of said first encapsulant at least partially defined by shape of said inner meniscus forming feature; and
a second encapsulant on said surface of said submount and covering said first encapsulant, the shape of said second encapsulant at least partially defined by the shape of said outer meniscus forming feature and wherein at least a surface of said second encapsulant conforms to the shape of said first encapsulant, and wherein said second encapsulant has a higher index of refraction than said first encapsulant.

24. An emitter package, comprising:
a submount;
a solid state emitter mounted to said submount, said submount comprising a non-circular meniscus forming feature, integral to said submount, around said solid state emitter; and
an encapsulant matrix on said submount and covering said solid state emitter, the size and shape of said encapsulant matrix at least partially defined by the dimensions and shape of said non-circular meniscus forming feature; and
a second encapsulant on said surface of said submount and covering said encapsulant matrix wherein at least a surface of said second encapsulant conforms to the shape of said encapsulant matrix, wherein said non-circular meniscus forming feature is substantially rectangular with rounded notches in at least one of the corners.

25. An emitter package, comprising:
a submount;
a solid state emitter mounted to said submount, said submount comprising a non-circular meniscus forming feature, integral to said submount, around said solid state emitter; and
an encapsulant matrix on said submount and covering said solid state emitter, the size and shape of said encapsulant matrix at least partially defined by the dimensions and shape of said non-circular meniscus forming feature; and
a second encapsulant on said surface of said submount and covering said encapsulant matrix wherein at least a surface of said second encapsulant conforms to the shape of said encapsulant matrix, wherein said meniscus forming feature is plus-shaped.

* * * * *